United States Patent
Jia et al.

(10) Patent No.: US 10,270,053 B2
(45) Date of Patent: Apr. 23, 2019

(54) ORGANIC LIGHT EMITTING DIODE, DISPLAY PANEL AND DISPLAY APPARATUS HAVING THE SAME, AND FABRICATING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenbin Jia, Beijing (CN); Li Sun, Beijing (CN); Minghung Hsu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/560,745

(22) PCT Filed: Sep. 30, 2016

(86) PCT No.: PCT/CN2016/101076
§ 371 (c)(1),
(2) Date: Sep. 22, 2017

(87) PCT Pub. No.: WO2018/058524
PCT Pub. Date: Apr. 5, 2018

(65) Prior Publication Data
US 2018/0254424 A1    Sep. 6, 2018

(51) Int. Cl.
*H01L 51/50* (2006.01)
*H01L 27/32* (2006.01)
*H01L 51/56* (2006.01)

(52) U.S. Cl.
CPC ........ *H01L 51/508* (2013.01); *H01L 27/3244* (2013.01); *H01L 51/5004* (2013.01);
(Continued)

(58) Field of Classification Search
CPC ..... H01L 51/50; H01L 51/50; H01L 51/5004; H01L 51/502; H01L 51/5024; H01L 51/508; H01L 51/509; H01L 51/5092
(Continued)

(56) References Cited

U.S. PATENT DOCUMENTS

| | | | |
|---|---|---|---|
| 2004/0100190 A1 | 5/2004 | Kim et al. | |
| 2011/0073844 A1 | 3/2011 | Pieh et al. | |
| 2016/0163771 A1* | 6/2016 | Jang .................... | H01L 27/3206 257/40 |

FOREIGN PATENT DOCUMENTS

| | | |
|---|---|---|
| CN | 1503605 A | 6/2004 |
| CN | 102034934 A | 4/2011 |
| CN | 104934542 A | 9/2015 |

OTHER PUBLICATIONS

International Search Report & Written Opinion dated Jun. 26, 2017 regarding PCT/CN2016/101076.

* cited by examiner

*Primary Examiner* — Monica D Harrison
(74) *Attorney, Agent, or Firm* — Intellectual Valley Law, P.C.

(57) ABSTRACT

The present application discloses an organic light emitting diode including a light emitting layer; a first electron transport layer including a first electron transport material on the light emitting layer; a hole scavenger layer including a hole scavenger material on a side of the first electron transport layer distal to the light emitting layer; and a second electron transport layer including a second electron transport material on a side of the hole scavenger layer distal to the first
(Continued)

electron transport layer. The hole scavenger material includes a first light emitting material capable of converting excitons generated by excess holes in the first or second electron transport layer to a ground state through radiative decay.

20 Claims, 3 Drawing Sheets

(52) U.S. Cl.
CPC ...... *H01L 51/5024* (2013.01); *H01L 51/5044* (2013.01); *H01L 51/5092* (2013.01); *H01L 51/56* (2013.01); *H01L 51/5016* (2013.01); *H01L 2251/552* (2013.01)

(58) Field of Classification Search
USPC .......................................................... 257/40
See application file for complete search history.

ORGANIC LIGHT EMITTING DIODE, DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/101076, filed Sep. 30, 2016, the contents of which are incorporated by reference in the entirety.

TECHNICAL FIELD

The present invention relates to display technology, more particularly, to an organic light emitting diode, a display panel and a display apparatus having the same, and fabricating method thereof.

BACKGROUND

An organic light emitting diode (OLED) typically include a cathode and an anode, and light emitting units between the cathode and the anode. An OLED can be a single unit OLED or a tandem OLED. A single unit OLED has only one light emitting unit, which includes a hole injection layer, a hole transport layer, a light emitting layer, an electron transport layer, and an electron injection layer. In an OLED, an electric field is applied between the anode and the cathode to inject electrons from the cathode into the light emitting layer and holes from the anode into the light-emitting layer. The electrons and the holes then recombine together in the light emitting layer to generate excitons. When the excitons return to the ground state, their energy is released in the form of light.

SUMMARY

In one aspect, the present invention provides an organic light emitting diode comprising a light emitting layer; a first electron transport layer comprising a first electron transport material on the light emitting layer; a hole scavenger layer comprising a hole scavenger material on a side of the first electron transport layer distal to the light emitting layer; and a second electron transport layer comprising a second electron transport material on a side of the hole scavenger layer distal to the first electron transport layer; wherein the hole scavenger material comprises a first light emitting material capable of converting excitons generated by excess holes in the first or second electron transport layer to a ground state through radiative decay.

Optionally, the hole scavenger layer has a thickness in the range of approximately 1 nm to approximately 5 nm.

Optionally, the hole scavenger material comprises a host material and a light emitting guest material.

Optionally, a ratio of the light emitting guest material to the host material is in the range of approximately 1% to approximately 3% by weight.

Optionally, the organic light emitting diode further comprises an electron injection layer comprising an electron injection material on a side of the second electron transport layer distal to the hole scavenger layer; wherein the light emitting layer comprises a second light emitting material; the host material has a lowest unoccupied molecular orbital (LUMO) energy level between those of the second light emitting material and the electron injection material.

Optionally, the first electron transport material and the second electron transport material are two different electron transport materials having different LUMO energy levels, the LUMO energy level of the host material is between those of the first electron transport material and the second electron transport material.

Optionally, the LUMO energy level of the host material is in the range of approximately 75% to approximately 125% of the LUMO energy level of the first electron transport material; and the LUMO energy level of the host material is in the range of approximately 75% to approximately 125% of the LUMO energy level of the second electron transport material.

Optionally, a difference between the LUMO energy level of the host material and the LUMO energy level of the first electron transport material is in the range of approximately −0.6 ev to approximately 0.6 ev; and a difference between the LUMO energy level of the host material and the LUMO energy level of the second electron transport material is in the range of approximately −0.6 ev to approximately 0.6 ev.

Optionally, the light emitting layer comprises a second light emitting material; and the first light emitting material and the second light emitting material comprises a same light emitting material.

Optionally, the light emitting layer comprises a second light emitting material; and the first light emitting material and the second light emitting material are different light emitting materials.

Optionally, the second light emitting material is a blue light emitting material, and the first light emitting material is a phosphorescent green light emitting material.

Optionally, the first light emitting material is a phosphorescent light emitting guest material.

Optionally, the first light emitting material is a phosphorescent yellow light emitting material.

Optionally, the first light emitting material is a fluorescent light emitting material.

Optionally, the LUMO energy level of the first light emitting material is in the range of approximately 75% to approximately 125% of the LUMO energy level of the first electron transport material; and the LUMO energy level of the first light emitting material is in the range of approximately 75% to approximately 125% of the LUMO energy level of the second electron transport material.

Optionally, a difference between the LUMO energy level of the first light emitting material and the LUMO energy level of the first electron transport material is in the range of approximately −0.6 ev to approximately 0.6 ev; and a difference between the LUMO energy level of the first light emitting material and the LUMO energy level of the second electron transport material is in the range of approximately −0.6 ev to approximately 0.6 ev.

Optionally, the first electron transport layer and the second electron transport layer are made of a same electron transport material.

In another aspect, the present invention provides a method of fabricating an organic light emitting diode, comprising forming a light emitting layer; forming a first electron transport layer comprising a first electron transport material on the light emitting layer; forming a hole scavenger layer comprising a hole scavenger material on a side of the first electron transport layer distal to the light emitting layer; and forming a second electron transport layer comprising a second electron transport material on a side of the hole scavenger layer distal to the first electron transport layer; wherein the hole scavenger material comprises a first light emitting material capable of converting excitons generated by excess holes in the first or second electron transport layer to a ground state through radiative decay.

In another aspect, the present invention provides a display panel comprising an organic light emitting diode described herein or fabricated by a method described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
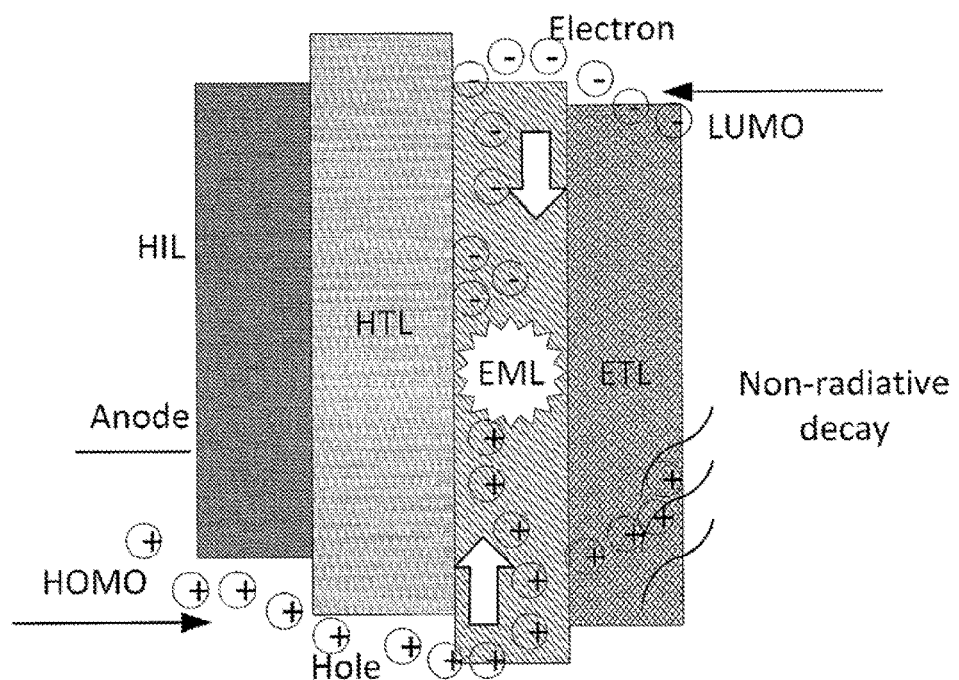
FIG. 1 is a diagram illustrating the structure of a conventional organic light emitting diode and exciton non-radiative decay pathway in the conventional organic light emitting diode.

FIG. 1 is a diagram illustrating the structure of a conventional organic light emitting diode and exciton non-radiative decay pathway in the conventional organic light emitting diode. Referring to FIG. 1, the conventional OLED includes a hole injection layer (HIL), a hole transport layer (HTL), a light emitting layer (EML), and an electron transport layer (ETL), from left to right. The OLED may further include an electron injection layer (EIL), a cathode and an anode. In the light emitting layer, electrons are injected into the conduction band of an organic material and holes are injected into the valence band of the organic material. The electrons and holes diffuse across the organic material, and recombine with each other to form excitons. The excitons decay radiatively, thereby producing light emission for image display. In some embodiments, the holes are conveyed by the hole transport layer to the recombination site, and the electrons are conveyed by the electron transport layer to the recombination site.

As shown in FIG. 1, when the holes transported and injected into the light emitting layer are in excess of the electrons transported and injected into the light emitting layer, a hole leakage current occurs. The hole leakage current is transmitted from the light emitting layer to the electron transport layer. The excess holes recombine with the electrons in the electron transport layer, forming excitons in the electron transport layer. Because the quantum efficiency in the electron transport layer is quite low, the excitons therein are converted to a ground state via a non-radiative decay pathway. The heat produced in the non-radiative decay process destabilizes the electron transport layer, reducing the lifetime of the OLED.

Accordingly, the present invention is directed to an organic light emitting diode, a display panel and a display apparatus having the same, and fabricating method thereof that substantially obviate one or more of the problems due to limitations and disadvantages of the related art. In one aspect, the present disclosure provides an organic light emitting diode. In some embodiments, the present organic light emitting diode includes an organic light emitting diode having a light emitting layer; a first electron transport layer including a first electron transport material on the light emitting layer; a hole scavenger layer including a hole scavenger material on a side of the first electron transport layer distal to the light emitting layer; and a second electron transport layer including a second electron transport material on a side of the hole scavenger layer distal to the first electron transport layer. The hole scavenger material is a material capable of converting excitons generated by excess holes in the first or second electron transport layer to a ground state through radiative decay.

Figure 2:
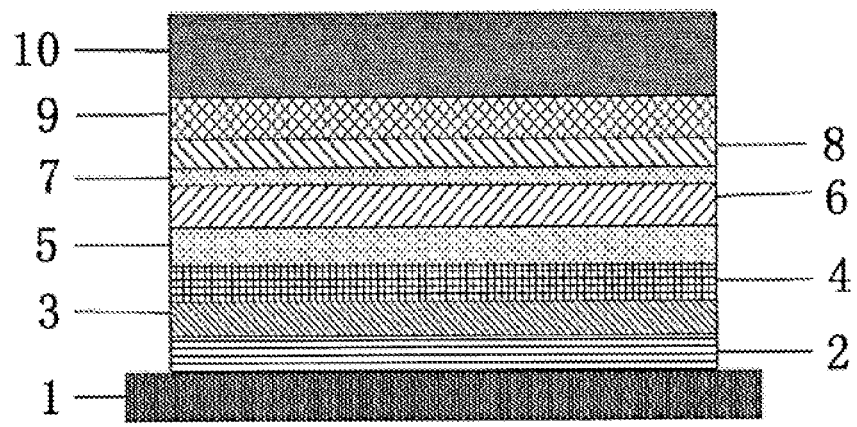
FIG. 2 is a diagram illustrating the structure of an organic light emitting diode in some embodiments.

FIG. 2 is a diagram illustrating the structure of an organic light emitting diode in some embodiments. Referring to FIG. 2, the organic light emitting diode includes a first electron transport layer 6, a second electrode transport layer 8, and a hole scavenger layer 7 between the first electron transport layer 6 and the second electrode transport layer 8. Specifically, as shown in FIG. 2, the organic light emitting diode in the embodiment includes a base substrate 1, a first electrode layer 2 on the base substrate 1, a hole injection layer 3 on a side of the first electrode layer 2 distal to the base substrate 1, a hole transport layer 4 on a side of the hole injection layer 3 distal to the first electrode layer 2, a light emitting layer 5 on a side of the hole transport layer 4 distal to the hole injection layer 3, a first electron transport layer 6 on a side of the light emitting layer 5 distal to the hole transport layer 4, a hole scavenger layer 7 on a side of the first electron transport layer 6 distal to the light emitting layer 5, a second electron transport layer 8 on a side of the hole scavenger layer 7 distal to the first electron transport layer 6, an electron injection layer 9 on a side of the second electron transport layer 8 distal to the hole scavenger layer 7, and a second electrode layer 10 on a side of the electron injection layer 9 distal to the second electron transport layer 8. Optionally, the first electrode layer 2 is an anode, and the second electrode layer 10 is a cathode.

Figure 3:
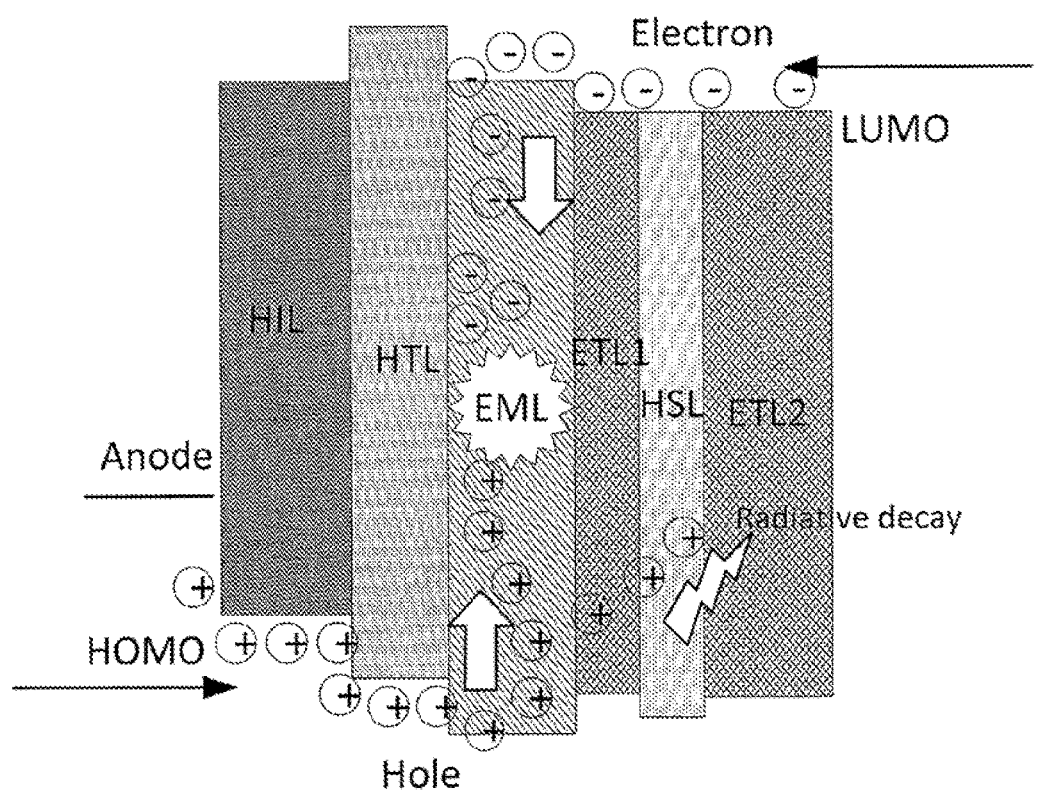
FIG. 3 is a diagram illustrating the structure of an organic light emitting diode and exciton radiative decay pathway in the organic light emitting diode in some embodiments.

FIG. 3 is a diagram illustrating the structure of an organic light emitting diode and exciton radiative decay pathway in the organic light emitting diode in some embodiments. Referring to FIG. 3, the organic light emitting diode in the embodiment includes a hole injection layer (HIL), a hole transport layer (HTL), a light emitting layer (EML), and a first electron transport layer (ETL1), a hole scavenger layer (HSL), and a second electron transport layer (ETL2), from left to right. The holes transported and injected into the light emitting layer EML are in excess of the electrons transported and injected into the light emitting layer EML. The excess holes are transmitted from the light emitting layer EML to the first electron transport layer ETL1, and reaches the hole scavenger layer HSL. The excess holes recombine with the electrons in the hole scavenger layer HSL, forming excitons in the hole scavenger layer HSL. The excitons in the hole scavenger layer are converted to a ground state via a radiative decay pathway. Because the energy is released through the radiative decay instead of non-radiative decay in a form of thermal energy, the thermal degradation in the electron transport layers ETL1 and ETL2 caused by non-radiative decay in the conventional organic light emitting diode is obviated. A longer lifetime is achieved in the present organic light emitting diode.

Various appropriate hole scavenger materials may be used to make the hole scavenger layer. Examples of appropriate hole scavenger materials include, but are not limited to, a fluorescent light emitting material and a phosphorescent light emitting material. Optionally, the fluorescent light emitting material includes a host material and a guest material for emitting fluorescent light. Optionally, the phosphorescent light emitting material includes a host material and a guest material for emitting phosphorescent light.

In some embodiments, the hole scavenger material is a phosphorescent light emitting material. Optionally, the phosphorescent light emitting material is a phosphorescent light emitting material that is capable of emitting light of a same color as that of light emitted by a light emitting layer in a same subpixel. For example, if the subpixel is a red subpixel, the phosphorescent light emitting material may be a phosphorescent red light emitting material. If the subpixel is a green subpixel, the phosphorescent light emitting material may be a phosphorescent green light emitting material. If the subpixel is a blue subpixel, the phosphorescent light emitting material may be a phosphorescent blue light emitting material. In some cases, the phosphorescent light emitting material may be a phosphorescent light emitting material that is capable of emitting light of a color different from that of light emitted by a light emitting layer in a same subpixel. For example, if the subpixel is a blue subpixel, the phosphorescent light emitting material may be a phosphorescent light emitting material that emits green light (e.g., light of a light green color). In another example, the phosphorescent light emitting material may be a phosphorescent light emitting material that emits yellow light. A hole scavenger layer made of a phosphorescent yellow light emitting material may be used in, e.g., a red subpixel, a green subpixel, and a blue subpixel.

In some embodiments, the light emitting material for making the hole scavenger layer includes a host material and a guest material. Because the function of the hole scavenger layer is to convert excitons formed by excess holes in the electron transport layer to a ground state through a radiative decay pathway, a relatively low dopant concentration may be sufficient. Optionally, the dopant concentration (i.e., guest material concentration) is lower than that of the light emitting layer in a same subpixel. For example, the dopant concentration (i.e., guest material concentration in the hole scavenger layer) may be in the range of approximately 1% to approximately 5% by weight, e.g., approximately 1% to approximately 2% by weight, approximately 2% to approximately 3% by weight, approximately 3% to approximately 4% by weight, approximately 1% to approximately 3% by weight, and approximately 3% to approximately 5% by weight.

In some embodiments, the hole scavenger material is a fluorescent light emitting material. Optionally, the fluorescent light emitting material is a fluorescent light emitting material that is capable of emitting light of a same color as that of light emitted by a light emitting layer in a same subpixel. For example, if the subpixel is a red subpixel, the fluorescent light emitting material may be a fluorescent red light emitting material. If the subpixel is a green subpixel, the fluorescent light emitting material may be a fluorescent green light emitting material. If the subpixel is a blue subpixel, the fluorescent light emitting material may be a fluorescent blue light emitting material. In some cases, the fluorescent light emitting material may be a fluorescent light emitting material that is capable of emitting light of a color different from that of light emitted by a light emitting layer in a same subpixel.

In some embodiments, the fluorescent light emitting material includes a host material and a guest material for emitting phosphorescent light. Optionally, the dopant concentration (i.e., guest material concentration) is lower than that of the light emitting layer in a same subpixel. For example, the dopant concentration (i.e., guest material concentration in the hole scavenger layer) may be in the range of approximately 1% to approximately 5% by weight, e.g., approximately 1% to approximately 2% by weight, approximately 2% to approximately 3% by weight, approximately 3% to approximately 4% by weight, approximately 1% to approximately 3% by weight, and approximately 3% to approximately 5% by weight.

The hole scavenger material may be selected so that an excellent energy level matching between the hole scavenger material and the electron transport material may be achieved. Specifically, the hole scavenger material (e.g., the light emitting material and/or a host material) may be selected so that a lowest unoccupied molecular orbital (LUMO) energy level of the hole scavenger material substantially matches with that of the electron transport material in the electron transport layer. When the hole scavenger material includes a host material and a guest material, the host material may be selected so that a LUMO energy level of the host material substantially matches with that of the electron transport material in the electron transport layer. Thus, in some embodiments, the hole scavenger material (e.g., the light emitting material and/or a host material) has a LUMO energy level between those of the light emitting layer and the electron injection layer.

In some embodiments, the LUMO energy level of the hole scavenger material (e.g., the host material of the hole scavenger material) is within 0.6 ev (e.g., within 0.5 ev, within 0.4 ev, within 0.3 ev, within 0.2 ev) of the LUMO energy level of the electron transport material. In some embodiments, the LUMO energy level of the hole scavenger material (e.g., the host material of the hole scavenger material) is in the range of approximately 75% to approximately 125% of the LUMO energy level of the electron transport material, e.g., approximately 80% to approximately 120%, approximately 85% to approximately 115%, approximately 90% to approximately 110%, approximately 95% to approximately 105%, or approximately 99% to approximately 101% of the LUMO energy level of the electron transport material.

In some embodiments, the electron transport material (e.g., the first electron transport material and/or the second electron transport material) may be selected so that an excellent energy level matching between the electron transport material and the hole scavenger material may be achieved. Specifically, the electron transport material may be selected so that a lowest unoccupied molecular orbital (LUMO) energy level of the electron transport material substantially matches with that of the hole scavenger material. When the hole scavenger material includes a host material and a guest material, the electron transport material may be selected so that a LUMO energy level of the electron transport material substantially matches with that of the host material in the hole scavenger layer.

For example, the LUMO energy level of the electron transport material is typically in the range of approximately 2.0 to approximately 3.5 ev. Optionally, an electron transport material having a relative low LUMO energy level may be selected. Optionally, the electron transport material has a LUMO energy level in the range of approximately 2.0 to approximately 2.5 ev. Optionally, the electron transport material has a LUMO energy level in the range of approximately 2.5 to approximately 3.0 ev. Optionally, the electron transport material has a LUMO energy level in the range of approximately 3.0 to approximately 3.5 ev. Optionally, both the electron transport material and the hole scavenger material (e.g., the host material of the hole scavenger material) have a LUMO energy level in the range of approximately 2.0 to approximately 2.5 ev. Optionally, both the electron transport material and the hole scavenger material (e.g., the host material of the hole scavenger material) have a LUMO energy level in the range of approximately 2.5 to approximately 3.0 ev. Optionally, both the electron transport material and the hole scavenger material (e.g., the host material of the hole scavenger material) have a LUMO energy level in the range of approximately 3.0 to approximately 3.5 ev.

In some embodiments, the first electron transport layer and the second electron transport layer are made of a same electron transport material. Optionally, the LUMO energy level of the hole scavenger material (e.g., the host material of the hole scavenger material) is within 0.6 ev (e.g., within 0.5 ev, within 0.4 ev, within 0.3 ev, within 0.2 ev) of the LUMO energy level of the same electron transport material. Optionally, the LUMO energy level of the hole scavenger material (e.g., the host material of the hole scavenger material) is in the range of approximately 75% to approximately 125% of the LUMO energy level of the same electron transport material, e.g., approximately 80% to approximately 120%, approximately 85% to approximately 115%, approximately 90% to approximately 110%, approximately 95% to approximately 105%, or approximately 99% to approximately 101% of the LUMO energy level of the same electron transport material.

In some embodiments, the first electron transport layer and the second electron transport layer are made of different electron transport materials. For example, the first electron transport layer is made of a first electron transport material and the second electron transport layer is made of a second electron transport material. Optionally, the LUMO energy level of the hole scavenger material (e.g., the host material of the hole scavenger material) is within 0.6 ev (e.g., within 0.5 ev, within 0.4 ev, within 0.3 ev, within 0.2 ev) of the LUMO energy level of the first electron transport material. Optionally, the LUMO energy level of the hole scavenger material (e.g., the host material of the hole scavenger material) is within 0.6 ev (e.g., within 0.5 ev, within 0.4 ev, within 0.3 ev, within 0.2 ev) of the LUMO energy level of the second electron transport material. Optionally, the LUMO energy level of the hole scavenger material (e.g., the host material of the hole scavenger material) is in the range of approximately 75% to approximately 125% of the LUMO energy level of the first electron transport material, e.g., approximately 80% to approximately 120%, approximately 85% to approximately 115%, approximately 90% to approximately 110%, approximately 95% to approximately 105%, or approximately 99% to approximately 101% of the LUMO energy level of the first electron transport material. Optionally, the LUMO energy level of the hole scavenger material (e.g., the host material of the hole scavenger material) is in the range of approximately 75% to approximately 125% of the LUMO energy level of the second electron transport material, e.g., approximately 80% to approximately 120%, approximately 85% to approximately 115%, approximately 90% to approximately 110%, approximately 95% to approximately 105%, or approximately 99% to approximately 101% of the LUMO energy level of the second electron transport material. Optionally, the LUMO energy level of the hole scavenger material (e.g., the host material of the hole scavenger material) is between those of the first electron transport material and the second electron transport material.

The hole scavenger layer may be made of any appropriate thickness. In some embodiments, the hole scavenger layer has a thickness in the range of approximately 1 nm to approximately 5 nm, e.g., approximately 1 nm to approximately 2 nm, approximately 2 nm to approximately 3 nm, approximately 3 nm to approximately 4 nm, and approximately 4 nm to approximately 5 nm. When the hole scavenger material is selected so that the light emitted from the hole scavenger material is of a same color as that of light emitted from the light emitting layer in the same subpixel, the hole scavenger layer may have a relatively larger thickness. When the hole scavenger material is selected so that the light emitted from the hole scavenger material is of a color different from that of light emitted from the light emitting layer in the same subpixel, the hole scavenger layer may have a relatively smaller thickness. Optionally, the electron transport layer has a thickness in the range of approximately 10 nm to approximately 40 nm, e.g., approximately 10 nm to approximately 20 nm, approximately 20 nm to approximately 30 nm, and approximately 30 nm to approximately 40 nm. In some cases, the first electron transport layer and the second electron transport layer have a total thickness in the range of approximately 10 nm to approximately 40 nm, e.g., approximately 10 nm to approximately 20 nm, approximately 20 nm to approximately 30 nm, and approximately 30 nm to approximately 40 nm. Optionally, the first electron transport layer has a thickness in the range of approximately 5 nm to approximately 25 nm, e.g., approximately 5 nm to approximately 10 nm, approximately 10 nm to approximately 15 nm, approximately 15 nm to approximately 20 nm and approximately 20 nm to approximately 25 nm. Optionally, the second electron transport layer has a thickness in the range of approximately 5 nm to approximately 25 nm, e.g., approximately 5 nm to approximately 10 nm, approximately 10 nm to approximately 15 nm, approximately 15 nm to approximately 20 nm and approximately 20 nm to approximately 25 nm. Optionally, the first electron transport layer has a thickness in the range of approximately 5 nm to approximately 25 nm, and the second electron transport layer has a thickness in the range of approximately 35 nm to approximately 15 nm.

Various appropriate electron transport materials may be used to make the electron transport layer. Examples of appropriate electron transport materials include, but are not limited to, 4,7,-diphenyl-1,10-phenanthroline, 2,9-Bis(naphthalen-2-yl)-4,7-diphenyl-1,10-phenanthroline, 2,9-dimethyl-4,7-diphenyl-1,10-phenanthroline, 8-hydroxyquinoline aluminum, 8-hydroxyquinoline lithium, Bis(8-hydroxy-2-methylquinoline)-(4-phenylphenoxy)aluminum, tris(8-quinolinolate)aluminum, 3-(biphenyl-4-yl)-5-(4-tertbutylphenyl)-4-phenyl-4H-1,2,4-triazole, bis(10-hydroxybenzo[h]quinolinato beryllium), and 1,3,5-tris(N-phenylbenzimiazole-2-yl)benzene.

Various hole scavenger materials may be used for making the hole scavenger layer. In some embodiments, the hole scavenger material includes a red light-emitting material. Optionally, the hole scavenger material further includes a host material for the red light-emitting material (guest material). Optionally, the red light-emitting material is a red fluorescent light-emitting material. Optionally, the red light-emitting material is a red phosphorescent light-emitting material. Optionally, the host material is a host material for red fluorescent light-emitting material. Optionally, the host material is a host material for red phosphorescent light-emitting material.

Examples of red fluorescent light-emitting materials for making the hole scavenger layer include, but are not limited to, perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene) propanedinitrile (DCJTB), and 4-(dicyanomethylene)-2-methyl-6-(p-dimethylaminostyryl)-4H-pyran (DCM).

Examples of red phosphorescent light-emitting materials for making the hole scavenger layer include, but are not limited to, metal complexes such as those of iridium, ruthenium, platinum, osmium, rhenium, and palladium. In these metal complexes, at least one of their ligands may have, for example, a phenylpyridine backbone, a bipyridyl backbone, or a porphyrin backbone. Specific examples include tris(1-phenylisoquinoline)iridium, bis[2-2'-benzo[4,5-α]thienyl pyridinato-N,C3']iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinato-N,C3'] iridium, and bis(2-phenylpyridine)iridium(acetylacetonate).

In some embodiments, the hole scavenger material includes a green light-emitting material. Optionally, the hole scavenger material further includes a host material for the green light-emitting material (guest material). Optionally, the green light-emitting material is a green fluorescent light-emitting material. Optionally, the green light-emitting material is a green phosphorescent light-emitting material. Optionally, the host material is a host material for green fluorescent light-emitting material. Optionally, the host material is a host material for green phosphorescent light-emitting material.

Examples of green fluorescent light-emitting materials for making the hole scavenger layer include, but are not limited to, coumarin derivatives, quinacridone derivatives, 9,10-bis [(9-ethyl-3-carbazolyl)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxyhexyloxy)-1,4-phenylene)].

Examples of green phosphorescent light-emitting materials for making the hole scavenger layer include, but are not limited to, metal complexes such as those of iridium, ruthenium, platinum, osmium, rhenium, and palladium. In these metal complexes, at least one of their ligands preferably has, for example, a phenylpyridine backbone, a bipyridyl backbone, or a porphyrin backbone. Specific examples include fac-tris(2-phenylpyridine)iridium (Ir(ppy)3), bis(2-phenylpyridinato-N,C2')iridium(acetylacetonate), and fac-tris [5-fluoro-2-(5-trifluoromethyl-2-pyridinyl)phenyl-C,N] iridium.

In some embodiments, the hole scavenger material includes a blue light-emitting material. Optionally, the hole scavenger material further includes a host material for the blue light-emitting material (guest material). Optionally, the blue light-emitting material is a blue fluorescent light-emitting material. Optionally, the blue light-emitting material is a blue phosphorescent light-emitting material. Optionally, the host material is a host material for blue fluorescent light-emitting material. Optionally, the host material is a host material for blue phosphorescent light-emitting material.

Examples of blue fluorescent light-emitting materials for making the hole scavenger layer include, but are not limited to, distyryl derivatives, fluoranthene derivatives, pyrene derivatives, perylene and derivatives thereof, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl(BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)].

Examples of blue phosphorescent light-emitting materials for making the hole scavenger layer include, hut are not limited to, metal complexes such as those of iridium, ruthenium, platinum, osmium, rhenium, and palladium. Specific examples include bis[4,6-difluorophenylpyridinato-N,C2']-picolinate-iridium, tris[2-(2,4-difluorophenyl)pyridinato-N, C2']iridium, bis[2-(3,5-trifluoromethyl)pyridinato-N,C2']-picolinate-iridium, and bis(4,6-difluorophenylpyridinato-N, C2')iridium(acetylacetonate).

Examples of host materials for a fluorescent light-emitting material (e.g., a red, green, or blue fluorescent light-emitting material) for making the hole scavenger layer include, but are not limited to, distyrylarylene derivatives, naphthacene derivatives, perylene derivatives, distyrylbenzene derivatives, distyrylamine derivatives, quinolinolato metal complexes such as tris(8-quinolinolato)aluminum (Alq3), triarylamine derivatives such as triphenylamine tetramer, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi).

Examples of host materials for a phosphorescent light-emitting material (e.g., a red, green, or blue phosphorescent light-emitting material) for making the hole scavenger layer include, but are not limited to, carbazole derivatives such as 3-phenyl-4-(1'-naphthyl)-5-phenylcarbazole and 4,4'-N,N'-dicarbazolebiphenyl (CBP).

In some embodiments, the organic light emitting diode includes a hole scavenger layer having a first light emitting material, and a light emitting layer having a second light emitting material. The light emitting layer may be made of a same material as the hole scavenger layer, e.g., the first light emitting material and the second light emitting material are the same. Optionally, the first light emitting material and the second light emitting material are different light emitting material. Optionally, the first light emitting material for making the hole scavenger layer is a phosphorescent light emitting material.

Optionally, the first light emitting material is a red light emitting material, and the second light emitting material is a red light emitting material. Optionally, the first light emitting material is a green light emitting material, and the second light emitting material is a green light emitting material. Optionally, the first light emitting material is a blue light emitting material, and the second light emitting material is a blue light emitting material. Optionally, the first light emitting material is a white light emitting material, and the second light emitting material is a white light emitting material. Optionally, the second light emitting material is a phosphorescent light emitting material.

Optionally, the first light emitting material for making the hole scavenger layer is a yellow light emitting material, and the second light emitting material for making the light emitting layer may be any one of a red light emitting material, a green light emitting material, and a blue light emitting material. Optionally, the first light emitting material is a phosphorescent yellow light emitting material.

Optionally, the second light emitting material for making the light emitting layer is a blue light emitting material, and the first light emitting material for making the hole scavenger layer is a green light emitting material (e.g., a light emitting material capable of emitting light of a light green color). Optionally, the first light emitting material is a phosphorescent green light emitting material.

Various appropriate light emitting materials may be used for making the light emitting layer. For example, various light emitting materials discussed in connection with the hole scavenger material may be used for making the light emitting layer. In some embodiments, the second light emitting material for making the light emitting layer includes a host material and a guest material. Because the function of the light emitting layer is to emit light, a relatively higher dopant concentration may be used as compared to that in the hole scavenger layer. Optionally, the dopant concentration (i.e., guest material concentration) for the light emitting layer is in the range of approximately 1% to approximately 10% by weight, e.g., approximately 1% to approximately 5% by weight and approximately 5% to approximately 10% by weight.

Various appropriate electron injection materials may be used for making the electron injection layer. Examples of appropriate electron injection materials include, but are not limited to, lithium fluoride and 8-hydroxyquinoline lithium.

Various appropriate hole transport materials may be used for making the hole transport layer. Examples of appropriate hole transport materials include, but are not limited to, various p-type polymer materials and various p-type low-molecular-weight materials, e.g., polythiophene, polyaniline, polypyrrole, and a mixture having poly-3,4-ethylenedioxythiophene and poly(sodium-p-styrenesulfonate).

Various appropriate hole injection materials may be used for making the hole injection layer. Examples of appropriate hole injection materials include, but are not limited to, poly(3,4-ethylenedioxythiophene) polystyrene sulfonate (PEDOT:PSS), polythiophene, polyaniline, polypyrrole, copper phthalocyanine and 4,4',4"-tris(N,N-phenyl-3-methylphenylamino)triphenylamine (m-MTDATA).

In another aspect, the present invention provides a method of fabricating an organic light emitting diode. In some embodiments, the method includes forming a light emitting layer; forming a first electron transport layer including a first electron transport material on the light emitting layer; forming a hole scavenger layer including a hole scavenger material on a side of the first electron transport layer distal to the light emitting layer; and forming a second electron transport layer including a second electron transport material on a side of the hole scavenger layer distal to the first electron transport layer. The hole scavenger material is a material capable of converting excitons generated by excess holes in the first or second electron transport layer to a ground state through radiative decay. The LUMO energy level of the hole scavenger material substantially matches with that of the first electron transport material and the second electron transport material.

Various appropriate methods may be used for making the present organic light emitting diode. In some embodiments, the hole scavenger layer is formed using a vapor deposition process. For example, the hole scavenger layer may be formed by vapor depositing a hole scavenger material on a side of the first electron transport layer distal to the base substrate. Optionally, the vapor deposition is performed in a deposition chamber. The deposition duration, pressure, and deposition rate may be adjusted for achieving a certain thickness or other characteristics of the hole scavenger layer. Optionally, the vapor deposition is performed under a pressure less than $5 \times 10^{-4}$ Pa in a deposition chamber.

In some embodiments, the hole scavenger layer is formed using a solution-based process. For example, the hole scavenger layer may be formed by coating a hole scavenger material on a side of first electron transport layer distal to the base substrate to produce a coated substrate, and drying the coated substrate thereby forming the hole scavenger layer.

In some embodiments, the method further includes one or more of the following steps: forming a first electrode layer on the base substrate; forming a hole injection layer on a side of the first electrode layer distal to the base substrate; forming a hole transport layer on a side of the hole injection layer distal to the first electrode layer; forming a light emitting layer on a side of the hole transport layer distal to the hole injection layer; forming an electron injection layer on a side of the second electron transport layer distal to the hole scavenger layer; and forming a second electrode layer on a side of the electron injection layer distal to the second electron transport layer. Optionally, the first electrode layer is an anode, and the second electrode layer is a cathode.

In one example, the method includes forming a first electrode layer on the base substrate, forming a hole injection layer on a side of the first electrode layer distal to the base substrate, forming a hole transport layer on a side of the hole injection layer distal to the first electrode layer, forming a light emitting layer on a side of the hole transport layer distal to the hole injection layer, forming a first electron transport layer on a side of the light emitting layer distal to the hole transport layer, forming a hole scavenger layer on a side of the first electron transport layer distal to the light emitting layer, forming a second electron transport layer on a side of the hole scavenger layer distal to the first electron transport layer, forming an electron injection layer on a side of the second electron transport layer distal to the hole scavenger layer, and forming a second electrode layer on a side of the electron injection layer distal to the second electron transport layer.

The hole scavenger layer may be formed to have any appropriate thickness. In some embodiments, the hole scavenger layer is formed to have a thickness in the range of approximately 1 nm to approximately 5 nm, e.g., approximately 1 nm to approximately 2 nm, approximately 2 nm to approximately 3 nm, approximately 3 nm to approximately 4 nm, and approximately 4 nm to approximately 5 nm. Optionally, the electron transport layer is formed to have a thickness in the range of approximately 10 nm to approximately 40 nm, e.g., approximately 10 nm to approximately 20 nm, approximately 20 nm to approximately 30 nm, and approximately 30 nm to approximately 40 nm. Optionally, the first electron transport layer has a thickness in the range of approximately 5 nm to approximately 25 nm, e.g., approximately 5 nm to approximately 10 nm, approximately 10 nm to approximately 15 nm, approximately 15 nm to approximately 20 run and approximately 20 nm to approximately 25 nm. Optionally, the second electron transport layer has a thickness in the range of approximately 5 nm to approximately 25 nm, e.g., approximately 5 nm to approximately 10 nm, approximately 10 nm to approximately 15 nm, approximately 15 nm to approximately 20 nm and approximately 20 nm to approximately 25 nm. Optionally, the first electron transport layer has a thickness in the range of approximately 5 nm to approximately 25 nm, and the second electron transport layer has a thickness in the range of approximately 35 nm to approximately 15 nm.

Optionally, the first electron transport layer and the second electron transport layer are made of a same electron transport material.

In some embodiments, the hole scavenger material includes a host material and a guest light emitting material. The hole scavenger layer may be formed using a vapor deposition process. For example, the deposition process may be performed in a chamber. The host material and the guest light emitting material are each placed in a deposition material vessel while being introduced into the chamber. In the deposition process, a co-deposition process is performed, e.g., the host material and the guest light emitting material are deposited concurrently or simultaneously in a single deposition process.

In another aspect, the present disclosure provides a display panel having an organic light emitting diode described herein or manufactured by a method described herein. In another aspect, the present disclosure provides a display apparatus having a display panel described herein. Examples of appropriate display apparatus includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode, comprising:
    a light emitting layer;
    a first electron transport layer comprising a first electron transport material on the light emitting layer;
    a hole scavenger layer comprising a hole scavenger material on a side of the first electron transport layer distal to the light emitting layer; and
    a second electron transport layer comprising a second electron transport material on a side of the hole scavenger layer distal to the first electron transport layer;
    wherein the hole scavenger material comprises a first light emitting material capable of converting excitons generated by excess holes in the first or second electron transport layer to a ground state through radiative decay; and
    the hole scavenger layer is in direct contact with the first electron transport layer and the second electron transport layer.

2. The organic light emitting diode of claim 1, wherein the hole scavenger layer has a thickness in the range of approximately 1 nm to approximately 5 nm.

3. The organic light emitting diode of claim 1, wherein the hole scavenger material comprises a host material and a light emitting guest material.

4. The organic light emitting diode of claim 3, wherein a ratio of the light emitting guest material to the host material is in the range of approximately 1% to approximately 3% by weight.

5. The organic light emitting diode of claim 3, further comprising an electron injection layer comprising an electron injection material on a side of the second electron transport layer distal to the hole scavenger layer;
    wherein the light emitting layer comprises a second light emitting material; the host material has a lowest unoccupied molecular orbital (LUMO) energy level between those of the second light emitting material and the electron injection material.

6. The organic light emitting diode of claim 3, wherein the first electron transport material and the second electron transport material are two different electron transport materials having different LUMO energy levels, the LUMO energy level of the host material is between those of the first electron transport material and the second electron transport material.

7. The organic light emitting diode of claim 3, wherein the LUMO energy level of the host material is in the range of approximately 75% to approximately 125% of the LUMO energy level of the first electron transport material; and the LUMO energy level of the host material is in the range of approximately 75% to approximately 125% of the LUMO energy level of the second electron transport material.

8. The organic light emitting diode of claim 3, wherein a difference between the LUMO energy level of the host material and the LUMO energy level of the first electron transport material is in the range of approximately −0.6 ev to approximately 0.6 ev; and a difference between the LUMO energy level of the host material and the LUMO energy level of the second electron transport material is in the range of approximately −0.6 ev to approximately 0.6 ev.

9. The organic light emitting diode of claim 1, wherein the light emitting layer comprises a second light emitting material; and the first light emitting material and the second light emitting material comprises a same light emitting material.

10. The organic light emitting diode of claim 1, wherein the light emitting layer comprises a second light emitting material; and the first light emitting material and the second light emitting material are different light emitting materials.

11. The organic light emitting diode of claim 10, wherein the second light emitting material is a blue light emitting material, and the first light emitting material is a phosphorescent green light emitting material.

12. The organic light emitting diode of claim 1, wherein the first light emitting material is a phosphorescent light emitting guest material.

13. The organic light emitting diode of claim 12, wherein the first light emitting material is a phosphorescent yellow light emitting material.

14. The organic light emitting diode of claim 1, wherein the first light emitting material is a fluorescent light emitting material.

15. The organic light emitting diode of claim 1, wherein the LUMO energy level of the first light emitting material is in the range of approximately 75% to approximately 125% of the LUMO energy level of the first electron transport material; and the LUMO energy level of the first light emitting material is in the range of approximately 75% to approximately 125% of the LUMO energy level of the second electron transport material.

16. The organic light emitting diode of claim 1, wherein a difference between the LUMO energy level of the first light emitting material and the LUMO energy level of the first electron transport material is in the range of approximately −0.6 ev to approximately 0.6 ev; and a difference between the LUMO energy level of the first light emitting material and the LUMO energy level of the second electron transport material is in the range of approximately −0.6 ev to approximately 0.6 ev.

17. The organic light emitting diode of claim 1, wherein the first electron transport layer and the second electron transport layer are made of a same electron transport material.

18. A display panel, comprising an organic light emitting diode of claim 1.

19. A display apparatus, comprising a display panel of claim 18.

20. A method of fabricating an organic light emitting diode, comprising:
    forming a light emitting layer;
    forming a first electron transport layer comprising a first electron transport material on the light emitting layer;
    forming a hole scavenger layer comprising a hole scavenger material on a side of the first electron transport layer distal to the light emitting layer; and
    forming a second electron transport layer comprising a second electron transport material on a side of the hole scavenger layer distal to the first electron transport layer;
    wherein the hole scavenger material comprises a first light emitting material capable of converting excitons generated by excess holes in the first or second electron transport layer to a ground state through radiative decay; and
    the hole scavenger layer is formed to be in direct contact with the first electron transport layer and the second electron transport layer.

* * * * *